United States Patent [19]

Oi et al.

[11] Patent Number: 5,283,474
[45] Date of Patent: Feb. 1, 1994

[54] CIRCUIT FOR DRIVING A LOAD BY USING SELECTIVELY ONE OF TWO DIFFERENT D.C. POWER SOURCES

[75] Inventors: Kunio Oi, Toyonaka; Makoto Kawaguchi, Yawata; Takashi Satoi, Tondabayashi, all of Japan

[73] Assignee: IDEC Izumi Corporation, Osaka, Japan

[21] Appl. No.: 720,668

[22] Filed: Jun. 25, 1991

[30] Foreign Application Priority Data

| Jun. 27, 1990 | [JP] | Japan | 2-169625 |
| Jun. 27, 1990 | [JP] | Japan | 2-169626 |
| Aug. 31, 1990 | [JP] | Japan | 2-91739 |

[51] Int. Cl.$^5$ ............................................ H02J 3/02
[52] U.S. Cl. ............................... 307/116; 307/22; 307/26
[58] Field of Search ........ 307/2, 22, 26, 39, 308–311, 307/116, 117, 128, 453; 361/170, 173, 175; 250/208.4, 214, 25

[56] References Cited

U.S. PATENT DOCUMENTS

4,787,007  11/1988  Matsumura et al. .................. 361/98

FOREIGN PATENT DOCUMENTS

| 0095579 | 12/1983 | European Pat. Off. |
| 2545919 | 4/1977 | Fed. Rep. of Germany |
| 2542468 | 9/1984 | France |
| 61-199416 | 9/1986 | Japan |
| 1171235 | 11/1969 | United Kingdom |

OTHER PUBLICATIONS

Siemens Components, vol. 18, No. 6, Dec. 1983, pp. 250–252, Berlin, Germany; A. Hauenstein, "Two-wire Inductive Proximity Switch for AC Voltages Using TCA 305 and SIPMOS Transistor", Left-hand column, lines 1–3, 22–28.
Patent Abstracts of Japan, vol. 14, No. 346 (E-956), Jul. 26, 1990; & JP-A-21-019420, (Asutetsukusu K.K.), May 7, 1990, *Abstract*.
Radio Fernsehen Elektronik, vol. 34, No. 5, May 1985, pp. 311–316, Ost-Berlin, DE; H.-J. Wägner et al.: pp. 311, left hand column, lines 1–14; 30–39; p. 312 central column, line 3—right-hand column, line 30; FIG. 1.
Radio Fernsehen Elektronik, vol. 34, No. 5, May 1985, pp. 311–316, Ost-Berlin, Germany; H.-J. Wagner, et al., "Integrierte Initiatorschaltungen B 303 D bix B 306 D".

Primary Examiner—Howard L. Williams
Assistant Examiner—Adhya Krishnan
Attorney, Agent, or Firm—Pollock, Vande Sande & Priddy

[57] ABSTRACT

A circuit of a detection switch for generating an output signal for driving a load device in accordance with the detection result by a detector is composed with a reduced number of components externally attached to an IC substrate which mounts integrally main circuit units such as a power source circuit unit, a detection circuit unit and an output circuit unit. The output circuit unit comprises a comparator which compares a judgment signal from the detection circuit unit with a reference signal when the load device is driven by D.C. power, or compares the voltage of an external D.C. power source with a predetermined voltage when the device driven by A.C. power, and an output driver which generates a driving signal for the load device in response to the output signal from the comparator. The detection circuit unit produces the judgment signal only when either the output circuit unit or the power source circuit unit is active. Further, the output circuit unit comprises an NPN output circuit with a protection function for load short-circuit breaks its current path based on the judgment signal and a switching output circuit operating in engagement with the NPN output circuit. A limiter and a switching circuit are provided between the NPN output circuit and the load device. The limiter supplies the NPN output circuit with an excess current exceeding a predetermined value flowing through the load device and the switching circuit controls the limiter in accordance with the output from the switching output circuit. Further, the detection switch circuit is connected with a display lamp for displaying the operation of the switch, and the output circuit unit has a selector for selecting the judgment signal or the output signal for display according to the connection of an external jumper.

8 Claims, 9 Drawing Sheets

F I G. 12
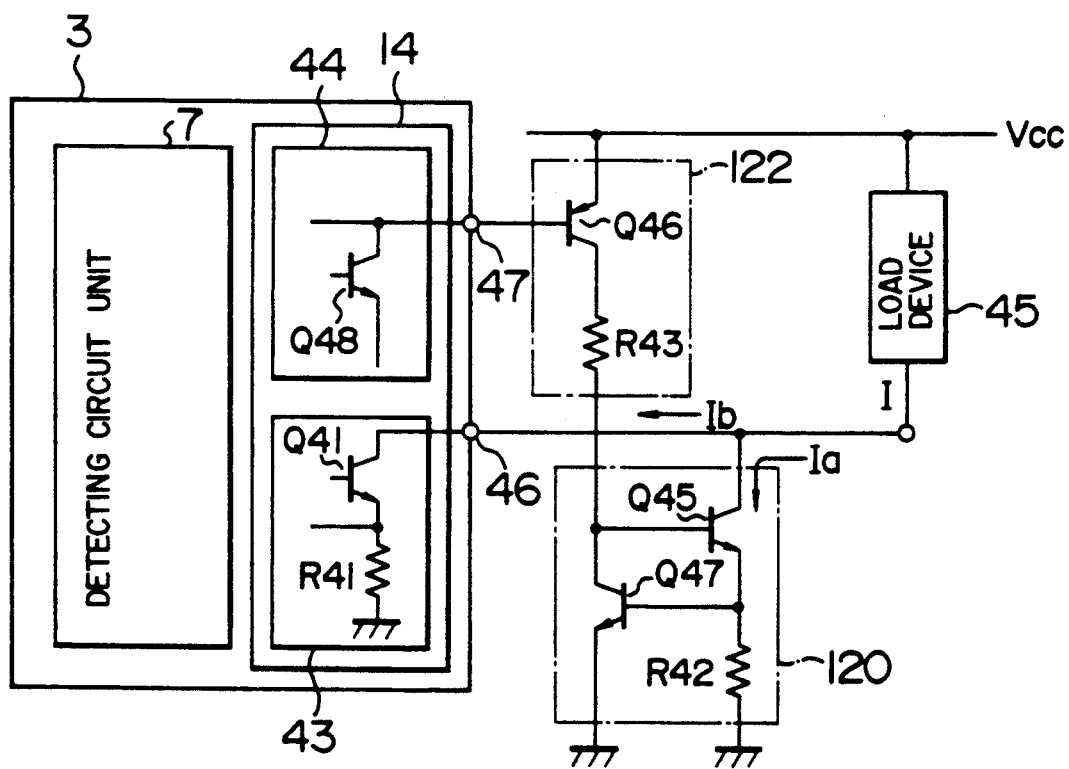

CIRCUIT FOR DRIVING A LOAD BY USING SELECTIVELY ONE OF TWO DIFFERENT D.C. POWER SOURCES

BACKGROUND OF THE INVENTION

1. Field of the Invention

The present invention relates to a detection switch circuit for generating an output signal in accordance with the detection result of a detector such as a photo-electric switch a proximity switch or the like, and more particularly to a detection switch circuit the main circuit parts of which are formed integrally on an integrated circuit (IC) substrate.

2. Description of the Related Art

Conventionally, a small-sized detection switch has been integrated as dense as possible to be incorporated in a smaller number of smaller-sized IC substrate(s). One example of typical detection switches formed on the IC substrate will be explained with reference to FIG. 1.

In FIG. 1, a detection switch 1 serves to drive a load device 2 connected therewith in accordance with a detection result, and comprises an IC substrate 3, a detector 4, a display lamp 5 and a delay circuit 6.

The load device 2 may be selected from various kinds of manipulators or displays including a valve solenoid, a magnetic relay, a lamp and a motor in accordance with a control purpose.

The detector 4 which generates a detecting signal based on a detected object or state may be incorporated in the detection switch circuit 1. Also, in accordance with the object to be detected, the detector 4 may be a primary switch such as a limit switch, a magnetic detector, a photo-detector comprising a projector and a receiver and a vibration sensor, or may be a composite sensor such as a moisture sensor, a smoke sensor and an acceleration sensor.

The IC substrate 3 which is the main circuit part of the detection switch 1 comprises a detecting circuit unit 7, an output circuit unit 8 and a power supply circuit 9 formed on a sheet of IC substrate. The IC substrate 3 is also incorporated in the detection switch.

The detecting circuit unit 7 serves to generate a judgment signal relative to the detection object in response to a detection output, and comprises an amplifying circuit 11 and an integrating circuit 12. The amplifying circuit 11 generates a stable output in response to a faint detection output from the detector 4. The integrating circuit 12 processes the stable signal to generate a judgment signal indicative of the judgment result of e.g. the presence of the detection object, the status thereof. If the detecting circuit unit 7 is simple, the above functions may not be separated.

The output circuit unit 8 is provided for insufficiency of the current capacitance of the output from the integrating circuit 12. In response to the judgment signal from the integrating circuit 12, the output circuit unit 8 produces a driving signal for the load device 2 and a display signal for the display lamp 5. The output circuit unit 8 is composed of an output signal generating circuit 13, an output driver 14 and a display circuit 15.

The output signal generating circuit 13 produces an output signal for controlling the load device 2 in accordance with the judgment signal from the integrating circuit 12. In response to the output signal from the circuit 13, the output driver 14 produces a driving signal having a large current capacitance for driving the load device 2. The output driver 14 is designed to have a function of short-circuit protection.

The output driver 14, which is incorporated in the IC substrate, includes an NPN output type and/or a PNP output type. The NPN output type driver comprises an NPN power transistor incorporated on the IC substrate, the output of which is supplied to an external terminal to be directly connected with the load device 2. On the other hand, the PNP output type driver usually comprises an NPN transistor incorporated on the IC substrate and an additional PNP power transistor provided externally. The reason is that the NPN power transistor can be easily designed with a relatively small size and large capacitance, and also the demand therefor is great. On the other hand, the PNP power transistor will be too large considering its current capacitance and also the demand therefor is relatively low. Therefore, it is preferable to externally attach it in accordance with capacity requirement rather than to prepare a large size IC substrate for a low demand. This applies to the detection switch in which both drivers of NPN output type and PNP output type are integrally incorporated on the same IC substrate in view of its versatility as shown in FIGS. 2 and 3. Specifically, the NPN output circuit 43 in the output driver 14 includes an NPN power transistor Q41 the output terminal of which is directly connected with a load device 45 whereas the PNP output circuit 44 includes an NPN transistor the output of which is connected with a load device 46 through a PNP power transistor Q42 externally attached to the IC substrate.

Incidentally, the output circuits 43 and 44 have known short-circuit protecting functions, respectively which are usually linked so that when one operates, the other also operates. A short-circuit protecting circuit suited for this function which requires no capacitor is suited for IC was proposed in JP-A-61-199416 to Tanigawa et al.

Since the NPN output circuit 43 is formed on the IC substrate 3, the output NPN power transistor Q41 is desired to be as small as possible, and so such an NPN power transistor as is not so large and can pass the driving current up to e.g. 100 mA is selected. In order to provide the driving current exceeding the 100 mA using such an NPN power transistor having a relatively small current capacity, the output therefrom is amplified by a transistor Q43 and a power transistor Q44 as shown in FIG. 3. Thus, the current permitted for the power transistor Q44 can be supplied to the load device 45. However, in the case of providing a large driving current in the above manner, the driving current flowing through the load device 45 flows in its most through the power transistor Q44 and almost does not flow through the NPN output circuit 43. Therefore, the short-circuit protection function of the NPN output circuit 43 does not work. In this case, in order to prevent the short-circuiting in the load device 45, a circuit having the short-circuit protection function externally attached to the IC substrate is separately used.

The display device 15 produces a lighting signal causing the display lamp 5 to flash on and off to indicate the detection state using the above output signal, or the operating state of the load device 2 using the driving signal.

The power supply circuit unit 9 transforms DC voltages between (Vcc and G) externally supplied through terminals 21 and 22 to supply the DC voltages required for the respective circuit units of the switch 1. The power supply circuit unit 9 is composed of a voltage regulating circuit 16 and a power supply resetting circuit 17. The voltage regulating circuit 16 serves to provide a stable DC voltage. The power supply resetting circuit 17 serves to monitor the output from the voltage regulating circuit 16 and to limit power supply until a stabilized voltage at a necessary level is obtained, thereby assuring a stabilized power supply. The power supply resetting circuit 17 recognizes the stability of the power supply to supply to the output driver 14 a signal permitting the driving signal to be output.

Meanwhile, in the case where the detection switch 1 is used for a two-wired AC circuit, a relatively large leakage current flows through the detection switch 1 when the load device 2 such as a relay is off so that as the case may be the load device 2 will not be completely turned off. In order to obviate such a phenomenon, the detection switch 1 is required to be operated by a small current. To this end, without using a power supply circuit unit 9 incorporated in the switch body, power may be supplied from an external constant voltage source for making a constant voltage on the basis of the AC power. For preparation of necessity of directly accepting an external DC power for driving the load device by the AC power like this case, terminals 27 and 28 for a jumper are provided on the IC substrate 3. The terminals 27 and 28 permit power to be supplied from the external power source when the power supply lines in the IC substrate are disconnected from the inner power supply circuit unit 9. Usually, terminals 27 and 28 are short-circuited by the jumper to use the power from the power supply circuit unit 9. On the other hand, in the case where power is to be supplied form the external power source, the jumper is removed to connect the terminal 27 with the external DC power source. In this case, the output driver 14 in the output circuit unit 8 is not used but the output from the integrating circuit 12 is used as a driving signal as it is.

Further, for the detection switch 1 to operate in low power consumption, the start-up speed of the switch 1 becomes low. The power supply resetting circuit 17 is not operable during the case, then a timer circuit is required to be separately attached to the above external constant power source in order to realize a long power supply resetting time.

The display lamp 5 which indicates the detection state or the operating state in response to the lighting signal is located at a position where it can be seen from the exterior of the detection switch 1. The display lamp 5 may be a light-emitting diode, a neon tube, an incandescent lamp, or the like.

The display manner of the display lamp 5, i.e. ON or OFF according to the detection signal, and indication according to the driving signal should be suitably selected in accordance with the purpose of using the detection switch 1 and the respective properties of the object to be detected and the load device. The display lamp which flashes on and off in accordance with the detecting signal is useful to monitor the presence of the object to be detected. The display lamp which flashes on and off in accordance with the driving signal is useful to monitor ON/OFF of the output circuit. For example, it is assumed that objects on a conveyer are classified using a photo-optical switch. In this case, in a system of detecting the object in terms of the light reflected from the object, as shown in FIG. 4, when the detector 4 receives the light reflected from the object, the detection circuit 7 generates a judgment signal and the output circuit unit 8 generates a driving signal based on the judgment signal. The detection signal and the driving signal are generated with the same timing so that the display lamp 5 displays both detection signal and driving signal. On the other hand, in a system of generating a detection signal when incident light is shaded by the object to be detected from the object, as shown in FIG. 5, the detection circuit 7 generates a judgment signal when the incident light on the detector 4 is shaded by the object to be detected, and the output circuit unit 8 generates a driving signal according to the judgment signal. The display lamp 5 displays either of the detection signal and the driving signal which are in an opposite phase to each other. Furthermore, in the case of using a sequencer with a low speed response time, as shown in FIG. 6, a suitable delay may inevitably be provided between the detection signal and the output signal.

The detection switch will be fabricated in accordance with individual purposes. If the type of the detection switch is one designed individually for a selected object to be monitored, a detection switch adaptive to monitor one object cannot be easily changed to one for another object. The detection switch has many applications under the various conditions of application and so must be changed in its design in accordance with the display manners as required.

The delay circuit 6 serves to delay the output signal from the detection switch 1 in order to cause the high speed response of the detector 4 to coincide with the low speed response in a drived device like a program controller, etc. The delay circuit 6 receives the judgment signal from the detection circuit unit 7 through a terminal 25 and sends a delayed judgment signal delayed within the circuit to the output circuit unit 8 through a terminal 26. Incidentally, if the terminal 25 and the terminal 26 are short-circuited by a jumper, the judgment signal relative to the object to be detected can be directly supplied to the output circuit unit 8. If the switch 1 is used with a driving device having a signal amplifying function, the output from the integrating circuit 12 can be directly used as a driving signal by connecting the terminal 25 with the driving device.

One concrete example of the delay circuit 6 is shown in FIG. 7. If the input side terminal 31 and output side terminal 32 in the delay circuit 6 in FIG. 7 are connected with the terminals 25 and 26 in FIG. 1, respectively, the detection switch 1 may have an off delay function. A resistor R1 and a capacitor C1 of the delay circuit (6) are used to set the off delay time. Resistors R3, R4 and R5 are used to provide a comparator 33 with hysteresis. Thus, chattering of the detection switch 1 can be prevented. Although the delay circuit 6 is incorporated within the detection switch 1, it is difficult to incorporate the delay circuit in the IC substrate 3 because the components such as capacitors required for the circuit arrangement are bulky. Also, it is not preferable to incorporate the delay circuit in the IC substrate for the convenience in design of setting different delay times. For these reasons, it is desired to attach the delay circuit outside the IC substrate 3.

Meanwhile, the detection switch described above is desired to be compact and inexpensive, and also the demand for supply of such a detection switch by mass-production is very great. However, the prior art requires components externally attached at various positions in order to assure the versatility in design so that the structure of the entire detection switch is made complicated and large scaled, therefore it was difficult to reduce the production cost.

In order to restrain the production cost, it is desired to integrate as many components as possible on an IC substrate. Therefore, it is preferable that a bulky component such as a reactance element is not used in the circuit and also no component is externally provided. However, the detection switch satisfying such conditions lost its essential switch function, or was burdened with many detection conditions. As a result, in many cases, the product value of the detection switch was lost.

SUMMARY OF THE INVENTION

An object of the present invention is to provide a detection switch which can reduce the number of components externally attached to an IC substrate required in the prior art to simplify its assembling and reduce the production cost, attain a function indispensable as a switch and deal with a change in an object to be detected through a simple operation.

Another object of the present invention is to provide a detection switch which can be given with an off delay function and also a longer power supply resetting time only by changing a jumper without adding any externally attached component.

Still another object of the present invention is to provide a detection switch which can provide a large output current by using a short-circuiting protection function provided in an IC within the switch without adding any externally attached component.

A further object of the present invention is to provide a detection switch which can be fabricated without increasing or decreasing the number of the terminals of an IC substrate, and the number of the externally attached components, irrespectively of whether the lighting of a display lamp is controlled by a judgment signal or a driving signal.

In accordance with the first embodiment of the present invention, there is provided a detection switch connected with detecting means for generating a detection signal in accordance with the presence or absence of an object to be detected, an external power source for supplying DC power to the switch and a load device and comprising a detection switch circuit for driving the load device on the basis of the detection signal, wherein the detection switch circuit includes a power source circuit unit, detection circuit unit and a output circuit unit integrally formed on an IC substrate. The output circuit unit comprises a comparator circuit outputting an ON and OFF signal as a result of comparison and having an external input terminal for receiving an input signal which is short-circuited with an external output terminal supplied with an output signal from the detection circuit unit when the load device is driven by D.C. power, wherein the comparison is carried out between a judgment signal derived from the detection signal which is received through the external input terminal and a reference voltage when the load device is driven by the D.C. power, and between a predetermined voltage and a voltage of the D.C. power produced from A.C. current and supplied by the external D.C. power source when the load device is driven by A.C. power, and an output driving circuit which generates an output for driving the load device in response to the output signal from the comparator circuit and the detection circuit unit comprises an output terminal for supplying the judgment signal connected with an external output terminal which is connected with the load device when driven by A.C. power so that the detection signal is used as a driving signal for the load device, and an OR circuit which receives the output signal from the comparator circuit and the power output from the power source circuit unit and produces the judgment signal through the external output terminal if either one of them is active.

In accordance with the second embodiment of the present invention, the detection switch is characterized in that the output circuit unit comprises an NPN output circuit including an NPN transistor which breaks and closes its current path on the basis of the judgment signal and has a protection function at short-circuit of the load and a switching output circuit for generating an ON/OFF signal in engagement with the NPN output circuit, and the detection switch circuit is provided with a limiter circuit and a switching circuit between the NPN output circuit and the load device, the limiter circuit, when a current exceeding a predetermined value flows through the load device, serving to supply the difference current between the flowing current and the predetermined value to the NPN output circuit, and the switching circuit serving to turn on or off the limiter circuit in accordance with the presence or absence of the output from the switching output circuit.

In accordance with the third embodiment of the present invention, the detection switch is characterized in that the detection switch circuit is provided with a display lamp for displaying the operation state of the detection, and the output circuit unit comprises a selector circuit for selecting the connection position of an external jumper wire to select the judgment signal or the output signal, and a display circuit for producing a lighting signal for the display lamp on the basis of the judgment signal or output signal selected by the selector circuit, and the IC substrate is provided with a terminal connecting the display lamp with the output from the display circuit.

In the detection switch according to the first embodiment of the present invention, the detection signal from the detector is supplied to the detection circuit unit on the IC substrate, and a judgment signal based on the detection signal is produced from the detection circuit unit. The judgment signal is compared with a reference voltage in a comparator circuit. In the case of using a D.C. power source, the output from the comparator circuit is supplied to an output circuit which in turn generates an output signal based on the output from the comparator circuit. A D.C. power from a voltage regulating circuit is also applied to the output circuit as well as to the detection circuit unit. The output circuit operates in response to the operation signal which is produced from a power source resetting circuit when the power supply voltage from the voltage regulating circuit exceeds a predetermined voltage. Therefore, in the case of using the D.C. power source, after the power supply voltage exceeds the predetermined voltage thereby to be stable, the output circuit unit produces an output signal receiving receiving the stable signal.

In this case, if a CR circuit is located between the detection circuit unit and the comparator circuit to provide a suitable time constant, an off-delay function which is required in supplying the output signal from the output circuit unit to a control device can be realized.

On the other hand, in the case of using an A.C. power source, the voltage of the power source is compared with a predetermined voltage by the comparator circuit. The output from the comparator circuit is supplied as an operation signal to the detection circuit unit through an OR circuit. Thus, only after the power supply voltage exceeds the predetermined voltage in the comparator circuit, the detection signal is produced from the detection circuit so that the comparator circuit can provide a power source resetting time.

In the detection switch according to the second aspect of the present invention, a current is supplied to the load device through a limiter circuit. This limiter circuit is on/off controlled by a first switching output circuit which is driven by the output from a second switching circuit incorporated in the IC substrate. The detection signal from a detection circuit unit is also supplied to an NPN output circuit and the second switching output circuit so that the output signal from the NPN output circuit is produced and at the same time that from the second switching output circuit is also produced. When the first switching output circuit is driven by the output signal from the second switching circuit, it turns on the limiter circuit. Thus, the current flows through the load device.

If a current exceeding a predetermined value flows through the load device, the limiter circuit sends the difference between the flowing current and the predetermined value to the NPN output circuit. If an excess current flows through the load device, a large current will be supplied to the NPN output circuit. In this case, the short-circuiting protecting function of the NPN output circuit operates so that the output signal therefrom disappears. Correspondingly, the output signal from the second switching output circuit also disappears.

In the detection switch according to the third embodiment of the present invention, the output signal from the output circuit unit, as well as the judgment signal from the detection circuit unit, are supplied to the display circuit. A signal selection unit in the display circuit selects the judgment signal or the output signal to be sent to a display lamp driving unit. In selecting the signal to be sent to the display lamp driving unit, the signal selection unit changes the signal in accordance with the connection of the display lamp connecting to the power source side or the output side of the voltage regulating circuit. Therefore, the connection of the display lamp decides the display function selected from a detection display system in which the display lamp is driven by the judgment signal and an operation display system driven by the output signal.

Other features and advantages of the invention will be apparent from the following description taken in connection with the accompanying drawings.

BRIEF DESCRIPTION OF THE DRAWINGS

FIG. 12 is a simplified block diagram of an arrangement where the output driver of the detection switch according to the present invention is used to control a load device.

DESCRIPTION OF THE PREFERRED EMBODIMENTS

Figure 1:
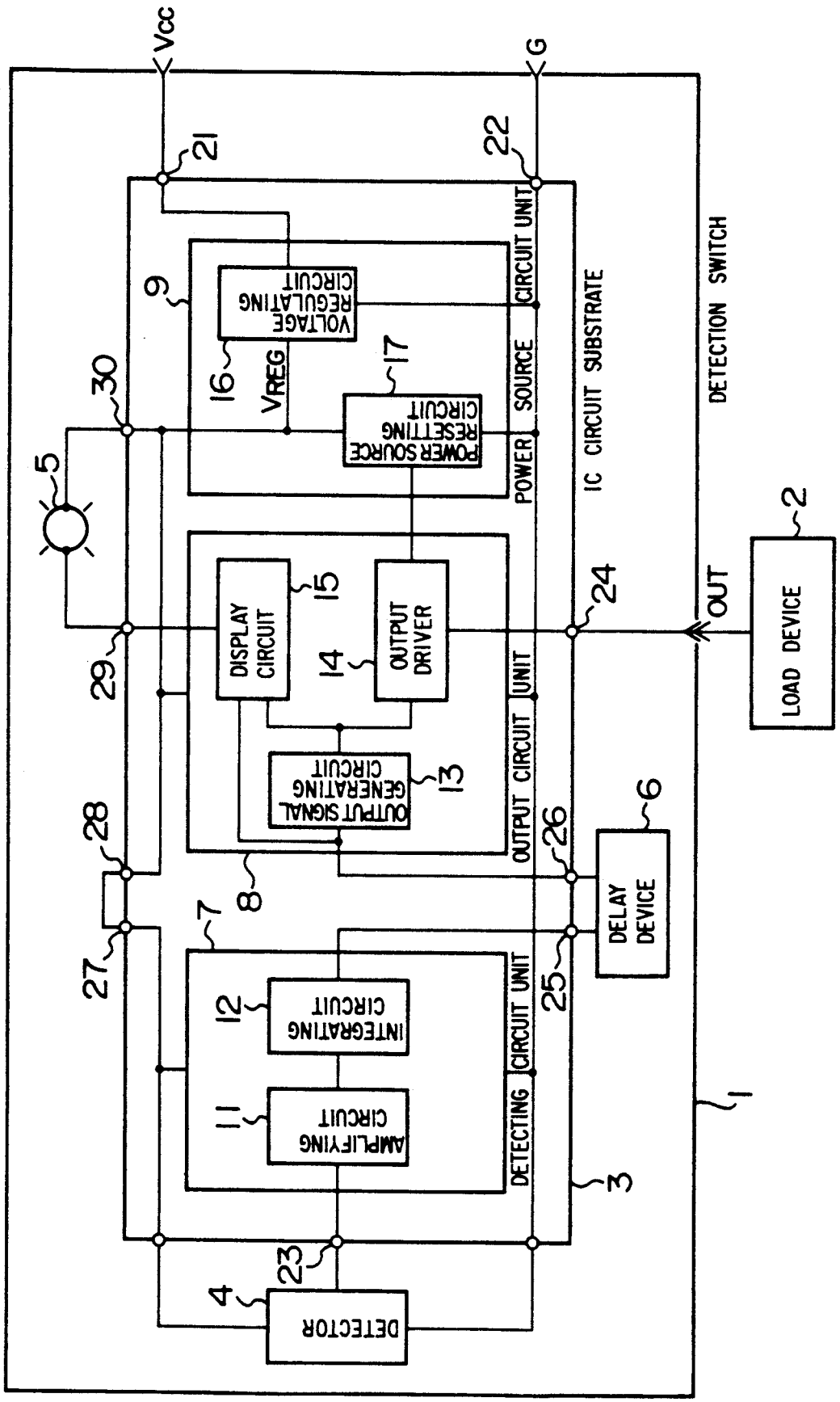
FIG. 1 is a block diagram of one example of the prior art detection switch.
Figure 8:
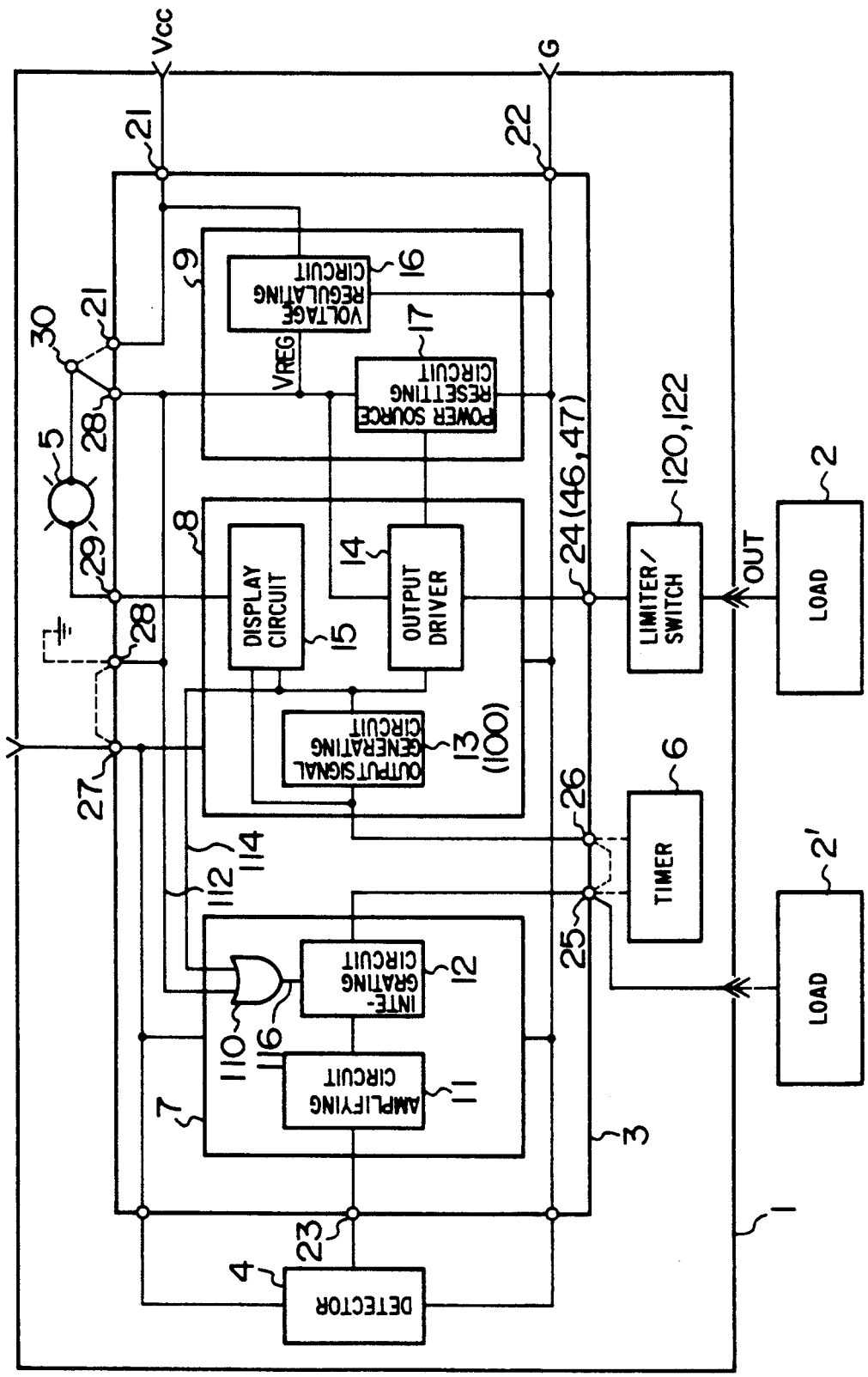
FIG. 8 is a block diagram of the detection switch according to the present invention.

FIG. 8 is a block diagram of one embodiment of the detection switch according to the present invention. In FIG. 8, like reference numerals or symbols refer to like elements in FIG. 1.

As seen from FIG. 8, a detection switch 1 is composed of a detector 4 for generating a detection signal in accordance with the presence or absence of an object to be detected, an IC substrate 3 on which the main circuit of the detection switch is formed, and a display lamp 5 for displaying the detected state. The detection switch 1 is connected to an external D.C. power source for supplying a D.C. voltage Vcc and to a load device 2.

The main circuit of the detection switch 1 serves to drive the load device 2 on the basis of the detection signal, and as in the prior art, comprises a detection circuit unit 7, an output circuit unit 8 and a power source circuit 9 which are incorporated on an IC substrate 3.

The power source circuit unit 9 comprises a voltage regulating circuit 16 and a power source resetting circuit 17 as in the prior art detection switch.

The output circuit unit 8 is composed of an output signal generating circuit 13, an output driver 14 and a display circuit 15 as in the prior art detection switch. However, it should be noted that the output signal generating circuit 13 comprises a comparator circuit 100 for comparing an input signal with a predetermind value.

The detection circuit 7 comprises an OR circuit 110 in addition to an amplifying circuit 11 and an integrating circuit 12 which are also included in the detection switch. The OR circuit 110 takes a logical sum of the outputs from the comparator circuit 100 and the voltage regulating circuit 16 and sends it to the integrating circuit 12. The integrating circuit 12 produces, as a judgment signal, a logical product of the integrated result of the detection signal supplied from the amplifying circuit 11 and the output from the OR circuit 110.

In the case where the detection switch 1 is used with a D.C. power source, the power source is connected with the Vcc terminal 21 of the IC substrate 3 and a regulated voltage terminal 28 is short-circuited with an external power input terminal 29. The output terminal 25 of the integrating circuit 12 is connected with the input terminal 26 of the output circuit unit 8. The output from the output circuit unit 8 extracted from its terminal 24 is used as an output from the detection switch 1. This is based on the same reason as in the prior art detection switch, and so the output from the detection switch 1 can have sufficient current capacity. It should be noted that if the output from the OR circuit 110 is 'Hi', the integrating circuit 12 will produce the detection signal in accordance with the detection state, whereas if the former is 'Lo', the latter always sends a signal indicative of non-detection to the terminal 25. In the state where the D.C. power source is connected with the Vcc terminal, the one input 112 from the voltage regulating circuit to the OR circuit 112 is always 'Hi' so that the output from the OR circuit 110 is always 'Hi' regardless of the other input 114. Therefore, the integrating circuit 112 provides the judgment signal according to the detection state to the terminal 25.

Figure 9:
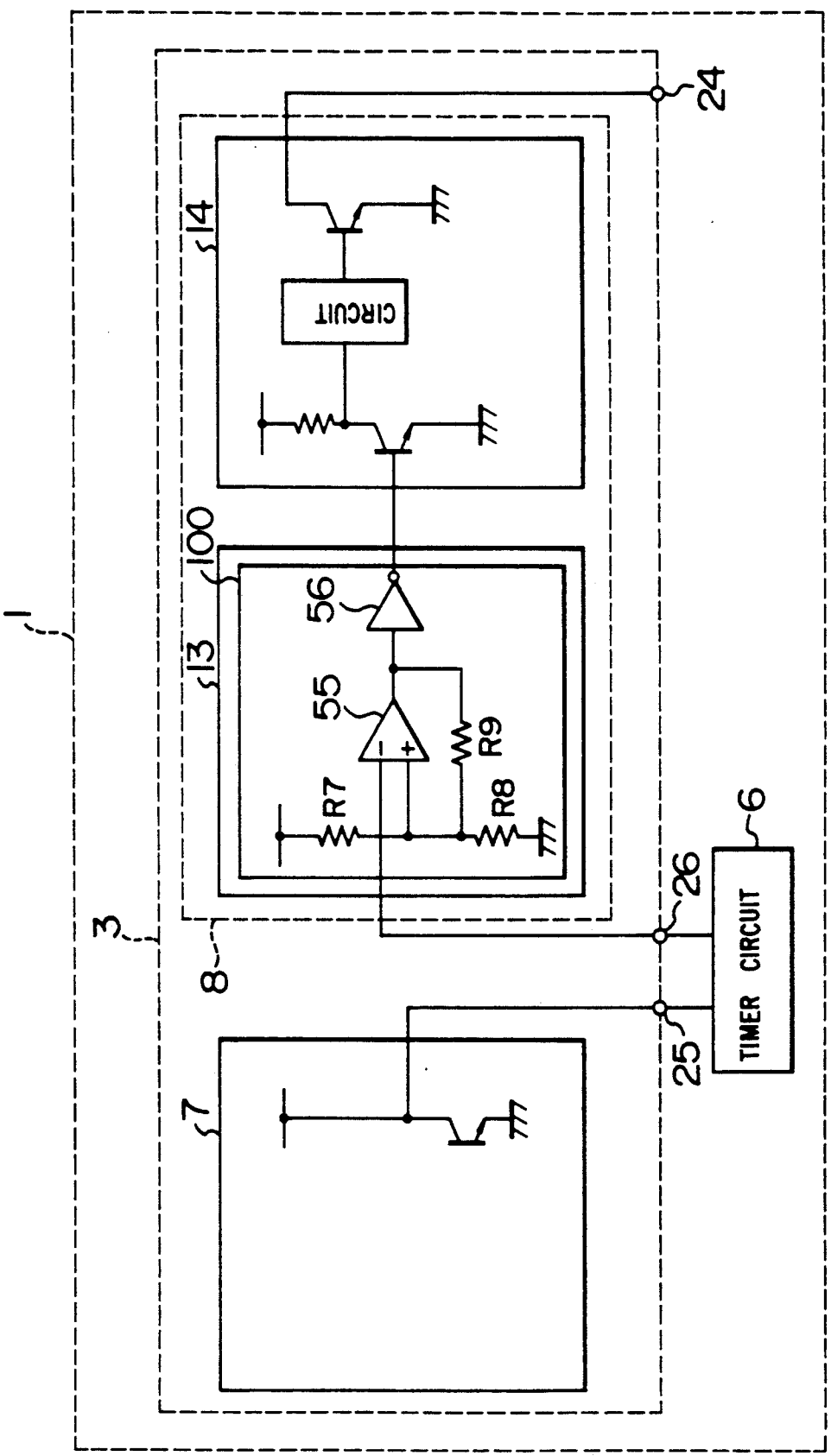
FIG. 9 is a block diagram of a partial arrangement of the output circuit unit in the detection switch according to the present invention.
Figure 10:
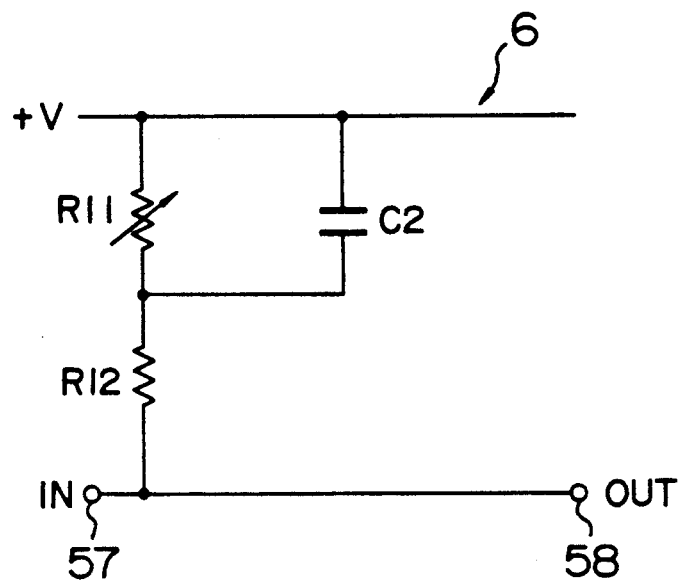
FIG. 10 is a circuit diagram of the RC circuit externally provided between the detection circuit unit and the output circuit unit of the detection switch according to the present invention.

FIG. 9 shows an arrangement of a part of the output circuit unit 8. A comparator circuit 100 which is located at the front state of the output circuit unit 8 is composed of resistors R7 to R9, a comparator 55 and inverter 56. The comparator 55 compares the judgment signal supplied through an input terminal 26 with a threshold value defined by the resistors R7 to R9. This threshold value varies between when the output from the comparator 55 is 'Hi' and when it is 'Lo'. Therefore, it provides hysteresis to the output from the comparator 55 for preventing chattering of the output from the detection switch 1. Further, in order to give the off-delay function to the detection switch 1, a timer circuit 6 may be connected between the output terminal 25 and the input terminal 26. This timer circuit 6 can be constructed by the CR circuit composed of a variable resistor R11, a resistor R12 and a capacitor C2 as shown in FIG. 10. The IN side terminal 57 of the timer circuit 6 is connected with the output terminal 25 whereas the OUT side thereof 58 is connected with the input terminal 26. Thus, the detection switch 1 can have an off-delay function time-set by the resistor R11, the capacitor C2 and the comparator 55.

Figure 11:
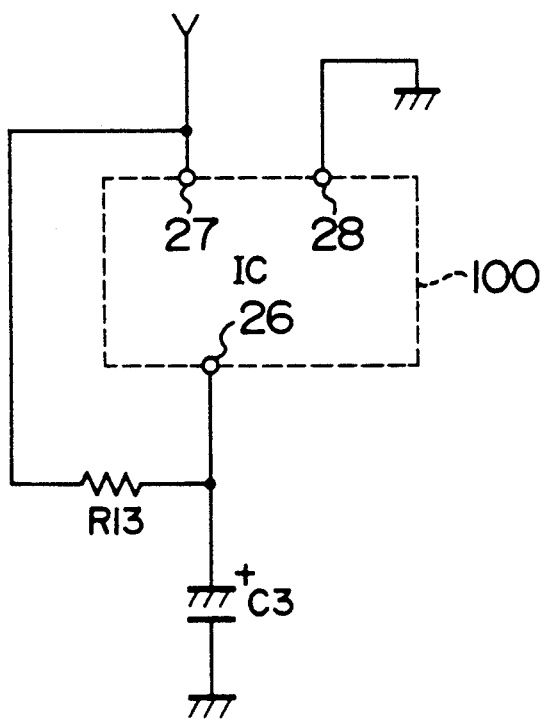
FIG. 11 is a circuit diagram showing the connection state in the case where the detection switch according to the present invention is used with an two-wired A.C. power source.

FIG. 11 shows the connection state where the detection switch circuit is used with a device driven by a two-wired A.C. power source.

In the case where the detection switch according to the present invention is used as a detection switch for a two-wired A.C. circuit requiring less power consumption, the output driver 14, the power source resetting circuit 17 and the voltage regulating circuit 16 on the IC substrate 3 are not used, but instead of those, a constant voltage source for creating a constant voltage from the A.C. power source is separately provided. In this case, the output from this constant voltage source is connected with the input terminal 27 of the IC substrate 3. Further, the output from the integrating circuit 12 extracted from the terminal 25 is used as an output from the detection switch 1 as it is. In operation, with the detection switch 1 connected with the constant voltage source for the two-wired A.C. power as shown in FIG. 11, after the power is turned on, the potential at the input terminal 26 of the comparator circuit 100 will increase up to the potential at the input terminal 27 in a manner delayed exponentially. When the potential at the terminal 26 reaches the threshold value of the comparator circuit 100, the output from the comparator 100, i.e. the input to the OR circuit 110 becomes 'Hi' (see FIGS. 8 and 9). On the other hand, in the case of using the A.C. power source, the input 112 to the OR circuit 110 is always 'Lo', so that when the input 114 becomes 'Hi', the output 116 from the OR circuit 110 also becomes 'Hi'. Therefore, when the time defined by the resistor R13, the capacitor C3 and the threshold value of the comparator circuit 100 has passed after the power is turned on, the output from the detection switch 1 appears at the terminal 25. Thus, the detection switch 1 can be provided with the power resetting function with an optional resetting time set by suitably selecting the resistor R13 and the capacitor C3.

In accordance with this embodiment, the comparator is located at the front stage of the output circuit unit within the IC substrate constituting the detection switch circuit so that the off-delay function can be realized only by externally attaching a minimum number of components constituting the RC circuit between the detection circuit unit and the output circuit unit. Also, the off-delay time can be accurately set by suitably setting the values of the capacitor and the resistors in the RC circuit.

In the case where the detection switch is used with a device driven by A.C. power, the above comparator circuit can be used for setting the power source resetting time for the detection switch. In this case, any resetting time can be set by selecting the values of the resistor and capacitor externally attached.

Now referring to FIG. 12, the detection switch according to the second embodiment of the present invention will be explained. This embodiment intends to control a load device using an output driver in the detection switch.

Figure 2:
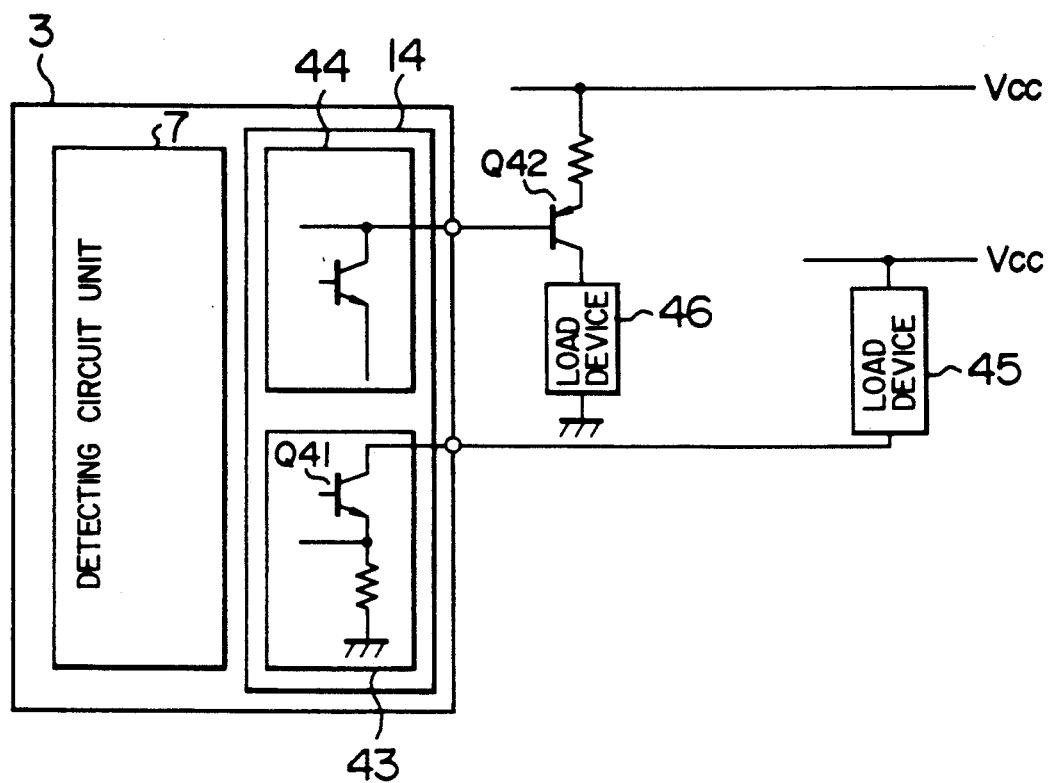
FIGS. 2 and 3 are circuit diagrams showing concrete arrangements using the prior art detection switch.
Figure 3:
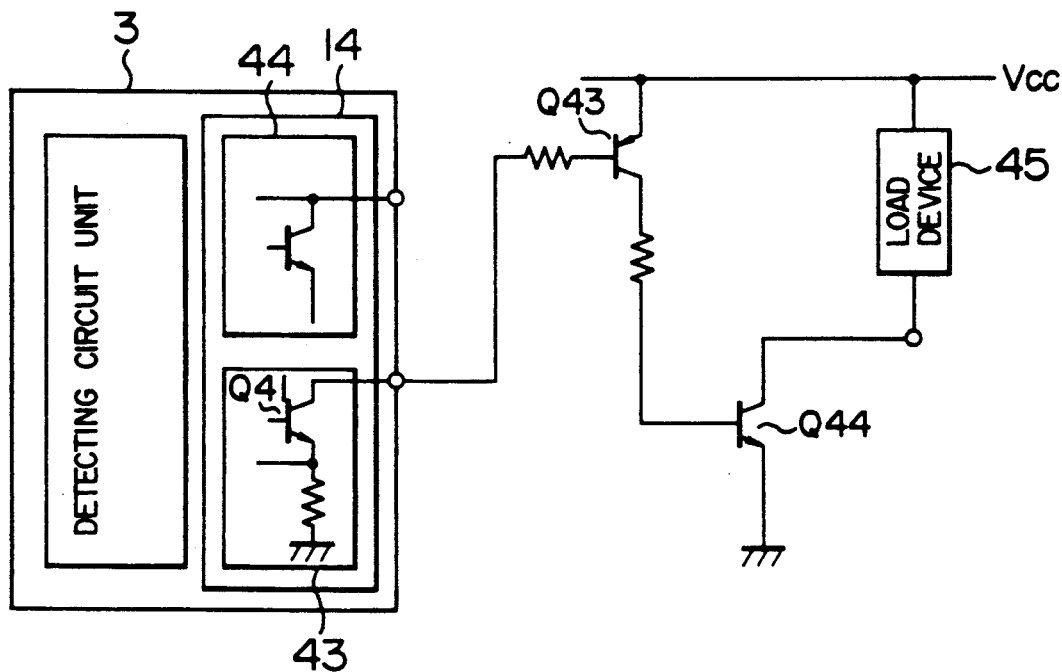
Figure 4:
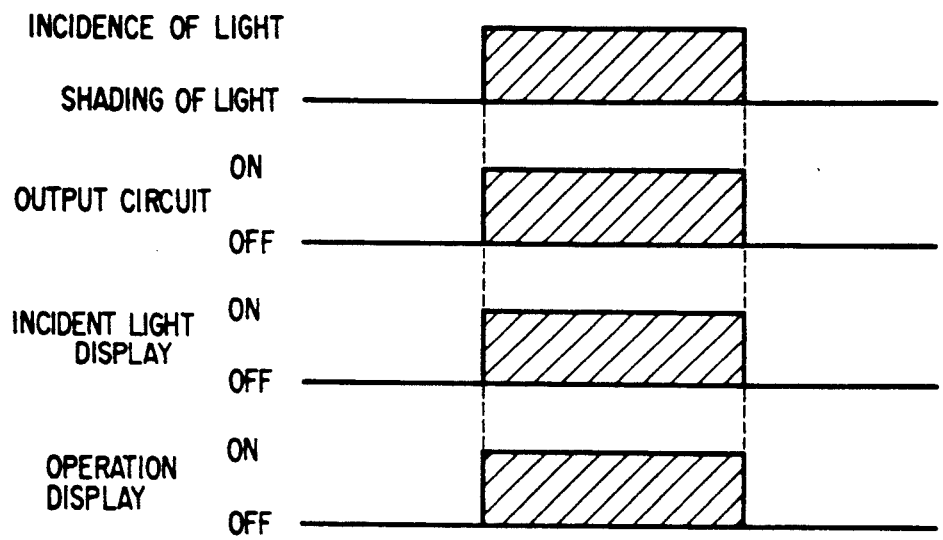
FIGS. 4, 5 and 6 are timing charts showing relation between different output states and display lamp states in the prior art detection switch.
Figure 5:
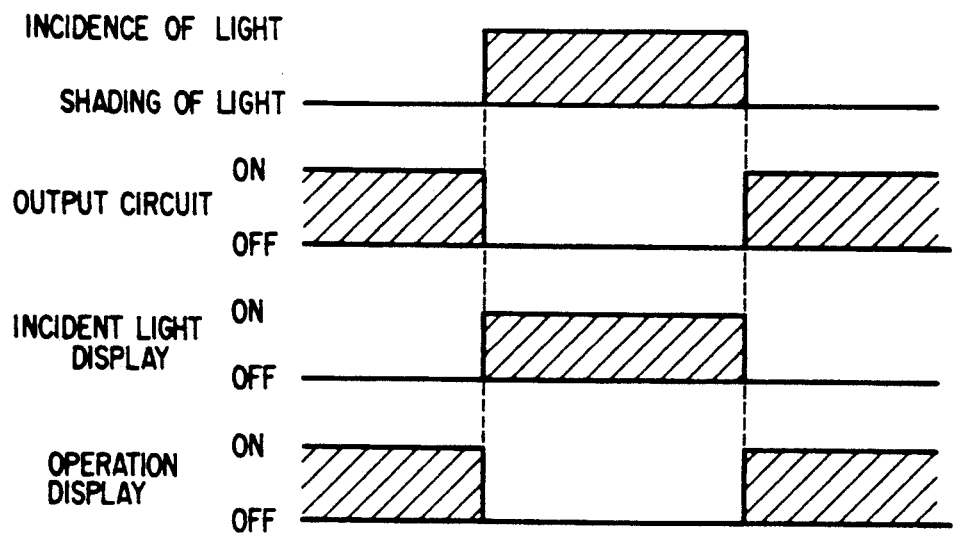
Figure 6:
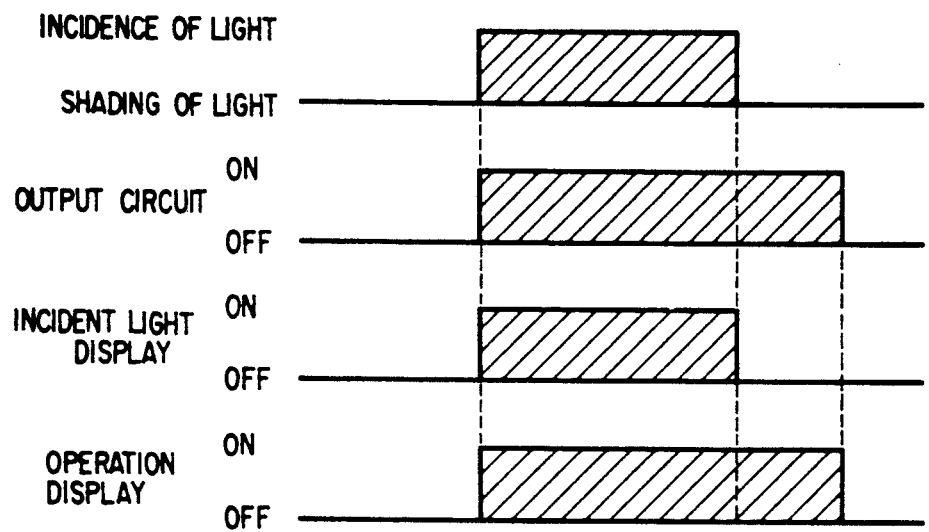
Figure 7:
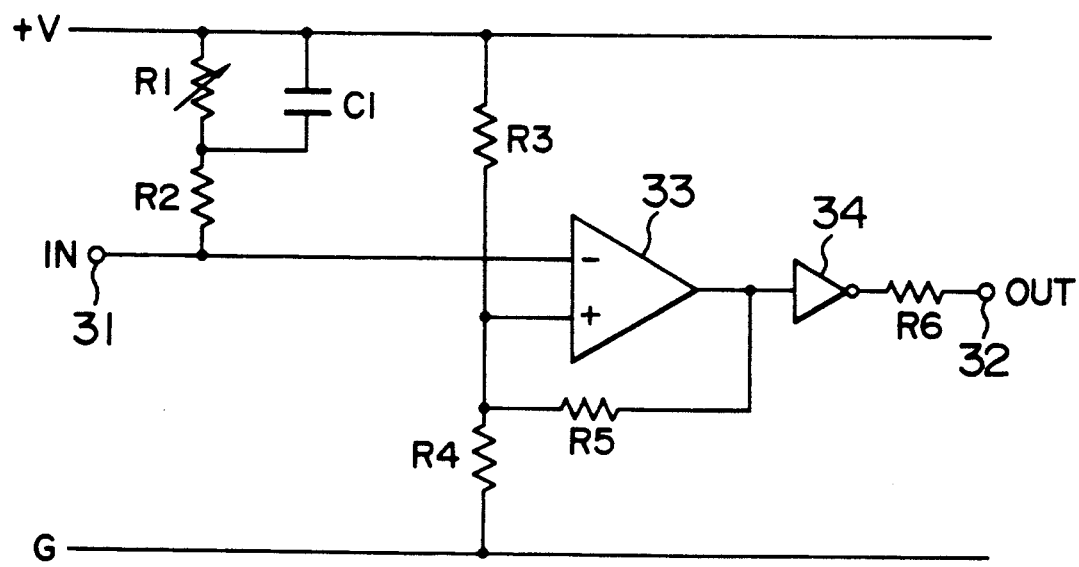
FIG. 7 is a circuit diagram showing an externally attached delay circuit which provides the prior art detection switch with an off-delay function.

It should be noted in this embodiment that a limiter circuit 120 and a switching circuit 122 for the output driver of the switch are externally attached to the IC substrate 3. The IC substrate has the same arrangement as that of FIGS. 2 and 3 and so is composed of a detection circuit unit 7, an NPN output circuit 43 and a PNP output circuit 44. The NPN output circuit 43 and the PNP output circuit 44 have the previously known protection function for short-circuit as described in connection with FIGS. 2 and 3 (the short-circuit protection circuit as disclosed in e.g. JP-A-61-199416 is used).

It should be noted that the detection signal from the detection circuit unit 7 is equally supplied to both, the NPN output circuit 43 and the PNP output circuit 44, so that an NPN transistor Q41 and an NPN transistor Q48 are simultaneously turned on and off. The limiter circuit 120 is composed of transistor Q45, Q47 and a resistor R42. A load device 45 is connected with the collector terminal of the transistor Q45 and also connected with the output terminal 46 of the NPN output circuit 43 on the IC substrate 3. The switching circuit 122 is composed of a transistor Q46 and a resistor R43. The base terminal of the transistor Q46 is connected with the output terminal 47 of the PNP output circuit 44.

In operation, when the transistor Q41 in the NPN output circuit 43 and the transistor Q48 in the PNP output circuit 44 turn on, all of the transistors Q44, Q45 and Q46 constituting the limiter circuit 120 and the switching circuit 122 turn on so that a current I flows through the load device 45. This current I passing through the load device 45 can flow through current paths Ia and Ib as shown in FIG. 12. The current flowing through the current path Ia, i.e. the collector current of the transistor Q45 is limited to the value ($I_t = -V_{BE}/R42$) defined by the base-emitter voltage $V_{BE}$ of the transistor Q47 and the resistor R42. In other words, a reference value of the current flowing through the current path Ia can be set by suitably selecting the resistance of the resistor R42.

If the current I passing through the load device 45 exceeds the reference value It, the current corresponding to the reference value It will flow through the current path Ia and the remaining current (I−It) will flow through the current path Ib. Thus, the difference current (I−It) flows into the NPN output circuit 43. When this difference current (I−It) exceeds a predetermined value, the short-circuit protection function of the NPN output circuit 43 operates. For example, with the value of the resistor R42 so as to provide It=100 mA, if the load current I is 120 mA, the current of 100 mA flows through the current path Ia while the current of 20 mA flows through the current path Ib. Additionally, when the short-circuit protection function operates, in a system which causes an output transistor to operate intermittently thereby prevent the output transistor from being damaged, the transistor Q46 in the switching circuit 122 will also operate intermittently. Thus, the limiter circuit 120 will also operate intermittently like the transistor Q41.

In accordance with this embodiment, the limiter circuit 120 and the switching circuit 122 are located between the IC substrate 3 and the load device 45 so that without losing the short-circuit protection function of the NPN output circuit 43, the IC substrate 3 can be used for the load device through which the driving current exceeding the capacity of the output transistor Q41 in the NPN output circuit 43.

Further, the current flowing through the current path Ia, i.e. the reference value of the limiter circuit 120 can be easily varied by varying the value of the resistor R42 so that it is possible to deal with a change in the driving current for the load device 45 due to exchange of the load device for which the detection switch is to be used.

Although the second switching output circuit is described as a PNP type of switching output circuit in the embodiment, other types of switching output circuits which turn on or off in engagement with the first NPN output circuit, e.g. an integrating circuit or LED driving circuit may be used.

In accordance with the arrangement according to this embodiment, the current passing through the load device may be exceeding the maximum driving current defined by the output transistor in the NPN output circuit incorporated in the IC substrate. Further, when the current passing through the load device exceeds the sum of the reference value defined by the limiter circuit and the maximum driving current of the NPN output transistor within the IC substrate, the short-circuit protection function of the NPN output circuit operates so that the outputs from the NPN output circuit and another switching output circuit within the IC substrate can be turned off. Therefore, a short-circuit protection circuit is not required to be externally attached to the IC substrate in order to realize this function. As a result, it is possible to fabricate a small-sized output driver at low production cost.

Figure 13:
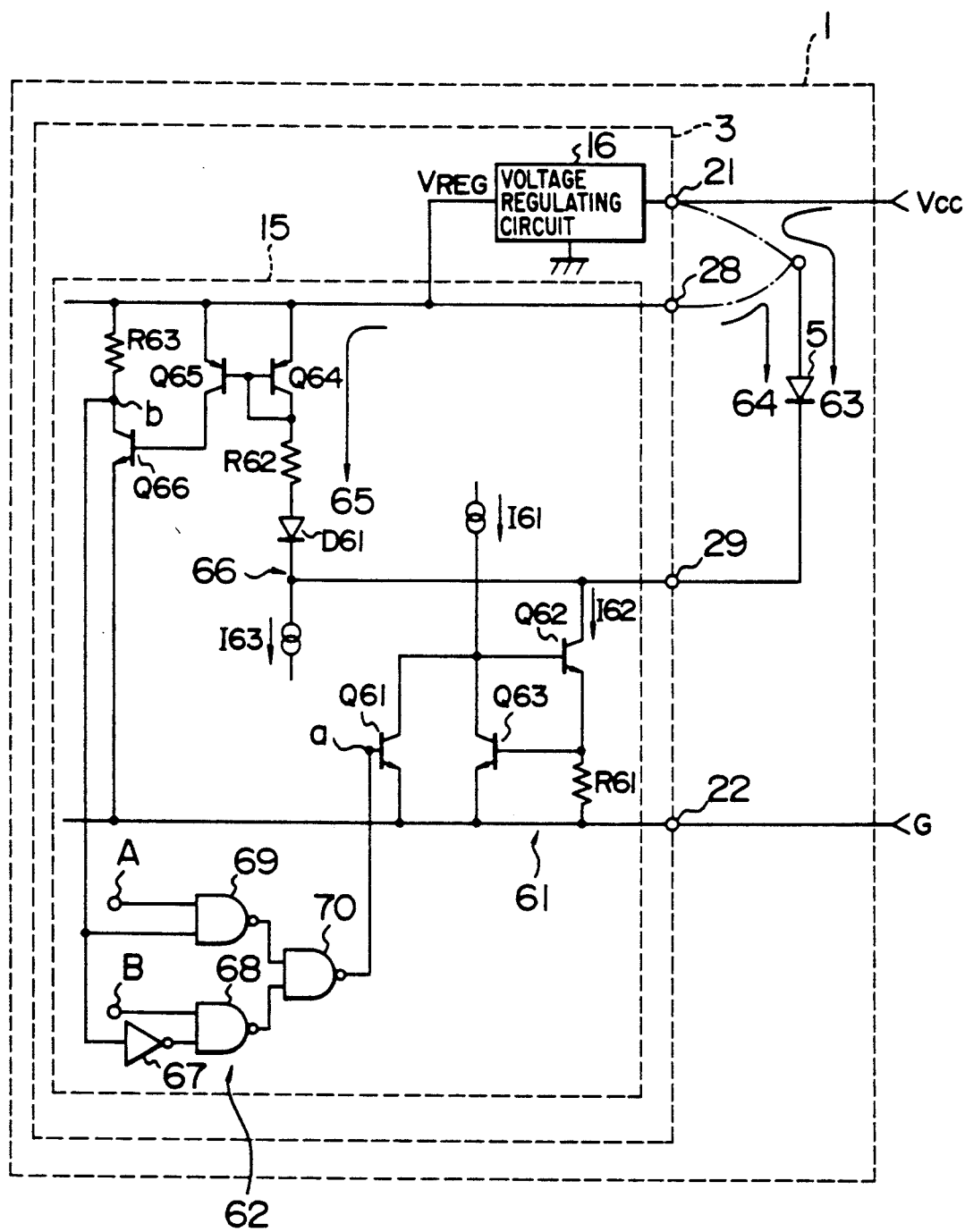
FIG. 13 is a circuit diagram of an arrangement of the display circuit of the detection switch according to the present invention.

FIG. 13 is a circuit diagram of the display circuit 15 in the detection switch 1 shown in FIG. 8.

As shown in FIG. 13, the display circuit 15 comprises a display lamp driving unit 61 and a signal selection unit 62. The output signal (signal A) from the output signal generating circuit 13 and the judgment signal (signal B) from the detection circuit unit 7 are supplied to the signal selection unit 62.

Now it is assumed that the display lamp 5 is a light emitting diode (LED) and its anode is connected to the terminal of the IC substrate 3 (the power supply side of the voltage regulating circuit 16). In this case, when the output signal a from the signal selection unit 62 is 'Lo', a transistor Q61 turns off and transistors Q62 and Q63 turn on. Thus, a constant current I62 defined by the base-emitter voltage $V_{BE}$ of the transistor Q63 and the value of a resistor R61 is supplied to the collector of the transistor Q62. Also, a constant current I63 always flows through the display circuit 15. These constant currents can flow through two paths consisting of a path 65 from $V_{REG}$ through transistor Q64, resistor R62 and diode D61, and another path 63 from Vcc through the display lamp 5. It is assumed that all of the constant currents I62 and I63 flow through the display lamp 5 on the path 63. In this case, if $Vcc - V_F > V_{REG}$, when $V_F$ is a forward voltage drop across the diode, the potential at a junction point 66 is always higher than $V_{REG}$ so that the constant currents I62 and I63 will not flow through the current path 65 and will not flow back from the junction point 66 toward $V_{REG}$ because of presence of a diode D61.

Meanwhile, $V_{REG}$ of 5 V, Vcc of 10–30 V and the forward voltage drop of about 2 V usually satisfy the above condition so that with the anode of the display lamp 5 connected with the terminal 21, the constant currents I62 and I63 flow only through the current path 63. Thus, transistors Q65 and Q66 turn off so that the signal b at the collector of the transistor Q66 becomes 'Hi'. As a result, the output signal (signal A) is supplied to the base terminal of the transistor Q61 in the display lamp driving unit 61 through NAND gates 69 and 70 so that the display lamp 5 will be driven in an operation displaying manner. In short, if the anode terminal of the display lamp is connected with the input side of the voltage regulating circuit 16, the output signal (signal A) from the output signal generating circuit 13 can be displayed.

Next, it is assumed that the anode of the display lamp 5 is connected with the terminal 28 of the IC substrate 3 (the regulated power side of the voltage regulating circuit 16). With the signal a being 'Lo', the above constant currents I62 and I63 can flow through the above current path 65 and another path 64 from the voltage regulating circuit 16 to display lamp 5 through the terminal 28. In this case, the potential at the junction point 66 is always lower than $V_{REG}$ regardless of the flowing manner of the constant currents I62 and I63 so that these currents flow through both current paths 64 and 65. Thus, if the anode of the display lamp 5 is connected with the terminal 28, the current always flows through the path 65. The transistors Q65 and Q66, therefore, turn on so that the above signal b becomes 'Lo'. As a result, the judgment signal (signal B) is supplied to the base terminal of the transistor Q61 in the display lamp driving unit 61 through NAND gates 68 and 70 so that the display lamp 5 will be driven in an incident light displaying manner. In short, if the anode terminal of the display lamp 5 is connected with the output side of the voltage regulating circuit 16, the output signal (signal B) from the detection circuit unit 7 can be displayed.

In accordance with this embodiment, the display lamp 5 can be selectively lit in the operation displaying manner or the incident light displaying manner by connecting the anode of the display lamp with the terminal 21 or 28 of the IC substrate 3. Specifically, in order to selectively supply the judgment signal from the detection circuit unit or the output signal from the output circuit unit to the display lamp driving unit, the connection point of the display lamp has only to be changed with no change in the circuit design. The lighting function of the display lamp can be very easily controlled without increasing the number of the terminals of the IC substrate and externally attaching any electric component.

We claim:

1. A circuit for driving a load in response to an externally applied input signal, said circuit being formed on an integrated circuit substrate and comprising:

first terminal means for connection to an external first DC power source;

second terminal means for connection to an external second DC power source of constant DC voltage;

a power source circuit unit for receiving a DC power from said first DC power source connected to said first terminal means and for generating and supplying to said load driving circuit a DC power of controlled DC voltage;

a detection circuit unit responsive to an input signal externally applied thereto and generating a first output signal;

an output circuit unit including a comparator for comparing the first output signal with a predetermined reference signal, when the first DC power source is connected to said first terminal means, and generating a second output signal when said first output signal is higher than the reference signal, said comparator, when the second DC power is connected to said second terminal means, generating a delayed second output signal at a predetermined time delay after connection of said constant voltage DC power to said second terminal means, said output circuit unit also including an output driving circuit for generating a third output signal in response to the second output signal;

an OR circuit connected to said detection circuit unit for allowing said detection circuit unit to generate the first output signal in the presence of any one of the controlled DC voltage generated from said power source circuit unit and said second output signal generated from said comparator circuit; and output terminal means for driving the load based on the third output signal from said output driving circuit, when the first DC power source is connected to said first terminal means, and based on the first output signal from said detection circuit unit when said second DC power source is connected to said second terminal means.

2. A circuit according to claim 1, further comprising an RC circuit connected between said detection circuit unit and said comparator circuit so that the first output signal is supplied to said comparator circuit through said RC circuit.

3. A circuit according to claim 1, wherein the constant DC voltage of said second DC power source connected to said second terminal means is applied through an RC circuit to said comparator circuit and said comparator circuit generates said second delayed output signal at a time delay determined by said RC circuit after application on of the constant DC voltage to said comparator circuit.

4. A circuit for driving a load in response to an externally applied input signal thereto, said circuit comprising:

power terminal means to be connected to an external DC power source;

output terminal means to be connected to the load;

a power source circuit unit for energizing said circuit by a DC power from said DC power source connected to said power terminal means;

a detection circuit unit responsive to an input signal externally applied thereto for generating a first output signal;

an output circuit comprising a load circuit through which a load current is supplied to the load through said output terminal means from said DC power source connected to said power terminal means, said load circuit including an NPN transistor circuit which is rendered conductive in response to said first output signal and connected so as to allow the load current to flow through the conductive NPN transistor circuit and a limiter circuit connected in parallel with said NPN transistor circuit so that a first main part of the load current flows through the limiter circuit and a second remaining part of the load current flows through the NPN transistor circuit, and limiter circuit operating to limit the main part of the load current flowing therethrough to a first predetermined value; and a switching circuit responsive to said second remaining part of the load current when exceeding a second predetermined value to make the load circuit non-conductive.

5. A circuit according to claim 4, wherein said switching circuit includes a PNP transistor circuit.

6. A circuit for driving a load in response to an externally applied input signal, formed on an integrated circuit substrate, said circuit comprising:

first power terminal means for connection to an external first DC power source for energizing the circuit from said first DC power source;

second power terminal means for connection to an external second DC power source of constant DC voltage energizing the circuit from said second DC power source;

first output terminal means for connection to the load;

second output terminal means for connection to an external display means;

a power source circuit unit for receiving a DC power from said first DC power source connected to said first terminal means and for generating a DC power of controlled DC voltage, which is supplied to said load driving circuit;

a detection circuit unit responsive to the externally applied input signal and generating a first output signal;

an output circuit unit responsive to said first output signal for generating a second output signal;

means for selecting one of said first and second output signals depending on whether the load driving circuit is energized by said first DC power source connected to said first terminal means, or said second DC power source connected to said second terminal means and for driving the load based on the selected one of said first and second output signals; and means responsive to the selected one of said first and second output signals for activating the display means.

7. A circuit arrangement according to claim 6, wherein said selecting means includes a jumper wire having one terminal which is connected to said display means and another terminal which is connected to said first power terminal when the circuit is energized by said first DC power source and to said second power terminal when the circuit is energized by said second DC power source.

8. A circuit arrangement according to claim 6, wherein said display means is a light emitting diode.

* * * * *